United States Patent [19]
Hornbeck

[11] Patent Number: 5,018,256
[45] Date of Patent: May 28, 1991

[54] ARCHITECTURE AND PROCESS FOR INTEGRATING DMD WITH CONTROL CIRCUIT SUBSTRATES

[75] Inventor: Larry J. Hornbeck, Van Alstyne, Tex.

[73] Assignee: Texas Instruments Incorporated, Dallas, Tex.

[21] Appl. No.: 546,331

[22] Filed: Jun. 29, 1990

[51] Int. Cl.⁵ .................. B44C 1/22; H01L 29/68; G02B 26/08
[52] U.S. Cl. .................. 29/25.01; 437/63; 437/228; 350/360
[58] Field of Search .......... 437/63, 228; 29/25.01; 350/360; 148/DIG. 73

[56] References Cited

U.S. PATENT DOCUMENTS

| | | | |
|---|---|---|---|
| 4,566,935 | 1/1986 | Hornbeck | 156/626 |
| 4,615,595 | 10/1986 | Hornbeck | 353/122 |
| 4,662,746 | 5/1987 | Hornbeck | 350/269 |
| 4,710,732 | 12/1987 | Hornbeck | 350/269 |
| 4,918,032 | 4/1990 | Jain | 437/228 |

Primary Examiner—Olik Chaudhuri
Assistant Examiner—Ourmazd S. Ojan
Attorney, Agent, or Firm—James C. Kesterson; James T. Comfort; Melvin Sharp

[57] ABSTRACT

DMD projection light values for HDTV have various manufacturing requirements, including the high yield integration of the DMD superstructure on top of an underlying CMOS address circuit. The CMOS chip surface contains several processing artifacts that can lead to reduced yield for the DMD superstructure. A modified DMD architecture and process are disclosed that minimizes the yield losses caused by these CMOS artifacts while also reducing parasitic coupling of the high voltage reset pulses to the underlying CMOS address circuitry.

4 Claims, 3 Drawing Sheets

ARCHITECTURE AND PROCESS FOR INTEGRATING DMD WITH CONTROL CIRCUIT SUBSTRATES

TECHNICAL FIELD OF THE INVENTION

This invention relates to deformable mirror devices and more particularly to a system for forming such devices in conjunction with control circuit substrates.

RELATED APPLICATIONS AND PATENTS

All of the following patent applications are cross-referenced to one another, and all have been assigned to Texas Instruments Incorporated. These applications have been concurrently filed and are hereby incorporated in this patent application by reference.

| Serial No. | |
| --- | --- |
| 07/546465 | Multi-Level Deformable Mirror Device |
| 07/546270 | Improved Bistable DMD Addressing Circuit and Method |
| 07/546331 | Improved Architecture and Process for Integrating DMD With Control Circuit Substrates |
| 07/546332 | Field Updated Deformable Mirror Device |

Also referenced herein and incorporated by reference is:

| | |
| --- | --- |
| Serial No. 07/355049 | Spatial Light Modulator and Method, now abandoned filed May 15, 1989; |
| Serial No. 07/408355 | Spatial Light Modulator and Method, now abandoned, filed September 14, 1989; |
| U.S. Pat. No. 4,662,746 | Spatial Light Modulator and Method Dated May 5, 1987; |
| U.S. Pat. No. 4,566,935 | Spatial Light Modulator and Method Dated January 28, 1986; and |
| U.S. Pat. No. 4,615,595 | Frame Addressed Spatial Light Modulator Dated October 7, 1986 |

BACKGROUND OF THE INVENTION

Bistable deformable mirror devices (DMDs) are the subject of the above-listed copending U.S. patent application entitled "Spatial Light Modulator" Ser. No. 07/408355. There are many uses for such devices, such as, for example, as a projection light valve for high-definition television (HDTV). For such a system, DMD pixel arrays as large as 1.8 megapixels are required, addressed by an underlying CMOS address circuit.

In order to minimize development costs and maximize chip yields, it is important to choose a well established, production tested CMOS technology. High volume CMOS wafer fabricators are reluctant to customize their CMOS process for a particular user's application. For this reason, it is necessary that the DMD superstructure place no special requirements on the CMOS process.

Unfortunately, there are several process artifacts in the CMOS multi-level metalization process that can cause yield losses in the DMD superstructure. These artifacts include aluminum hillocks, pinholes in the protective oxide, a nonplanar chip surface and protective oxide contacts with a steep sidewall angle.

An example of a DMD device is shown in above-listed patent application, Ser. No. 07/355049 entitled "Spatial Light Modulator" filed May 15, 1989. As shown in the aforementioned application, the DMD device has a beam reflective surface which is deformed, or pivoted, into contact with a landing pad or electrode under control of voltages selectively applied either by the beam or to a control electrode or to both.

Aluminum hillocks can cause weak spots in the overlying protective oxide, leading to dielectric breakdown when high voltage reset pulses, which are necessary with DMD system arrays, are applied to the overlying landing electrodes.

An additional problem is that the hillocks are replicated by the electrode metal and when hillocks are under the DMD address control electrodes, the DMD torsion beam can land on these hillocks, causing the address electrodes to be shorted to the beam. When hillocks are under the landing electrode, the beam is prevented from rotating to the full deflection angle, thereby reducing the light-to-dark effect of the deforming beam.

In addition, pinholes in the protective oxide cause shorts between the electrode metal and the final CMOS metalization layer, thereby further reducing the yield of good devices and also reducing their life expectancy.

The final CMOS metalization layer containing the electrical circuits is not planarized and it produces steps in the protective oxide which can lead to residual filaments when the electrode metal is etched with an anisotropic plasma etch. Thus, filaments cause shorts between neighboring electrodes.

Finally, the protective oxide contacts in a standard CMOS process are not etched with sloped sidewalls, but rather tend to be nearly vertical. This can lead to poor step coverage of the electrode metal down into the contacts.

A need therefore exists in the art for a DMD device which is constructed integral with a CMOS substrate without being effected by the typical CMOS artifacts.

SUMMARY OF THE INVENTION

A modified DMD superstructure architecture that eliminates the effects of CMOS artifacts has been devised consisting of a planarizing organic first spacer (typically 0.5 μm thick) spun over the CMOS address circuit prior to the electrode metal deposition. Contact openings and electrode support post holes are patterned in this first spacer which is then deep UV hardened to a temperature 10° to 20° C. hotter than the hardening temperature for the next level spacer which is typically 180° C. The first spacer is hardened to give slightly tapered sidewalls to the contacts and support posts for good metal step coverage.

The conventional DMD process consists of the following steps: First the electrode metal is deposited and patterned followed by the deposition of the second spacer and patterning of support post holes. Then the hinge and beam metal patterns are formed by deposition and patterning of metal layers on the surface of the second spacer. Finally, the air gaps under the deflectable beam elements are formed by a plasma undercut. During the plasma undercut of the beams, the first spacer and the second beam or support spacer are removed. The plasma undercut forms an air gap between the electrode and the underlying CMOS address circuit. The electrode is supported by the contacts and electrode support posts.

The effect of the spacer on the CMOS process artifacts is that the gaps between leads of the final CMOS metalization layers are planarized. Hillocks are planarized and air gap isolation is provided over the weakened overlying protective oxide. Air gap isolation is also provided over pinholes in the protective oxide. Finally, the steep oxide sidewalls of the protective oxide contacts are replaced by the sloped contacts of the spacer.

There are additional benefits to the modified DMD superstructure architecture. Because the landing electrodes are air isolated from the address circuit, there is reduced parasitic coupling of the fast rise-time, high-voltage reset pulse train to the underlying address circuit. This coupling, if uncontrolled, can produce voltage spikes on the gates of the address transistors, causing the transistors to momentarily turn on at the wrong time.

Finally, because the address electrodes are air isolated, they have reduced capacitance. It is therefore possible with this modified DMD superstructure architecture to build a frame-addressed DMD where the address electrode rather than the beam is charge-addressed.

One technical advantage of adding a spacer layer in the manner described is that the new architecture minimizes the yield loss caused by CMOS process artifacts, reduces parasitic coupling between the DMD and CMOS and provides an alternate architecture for the charge-addressed DMD.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
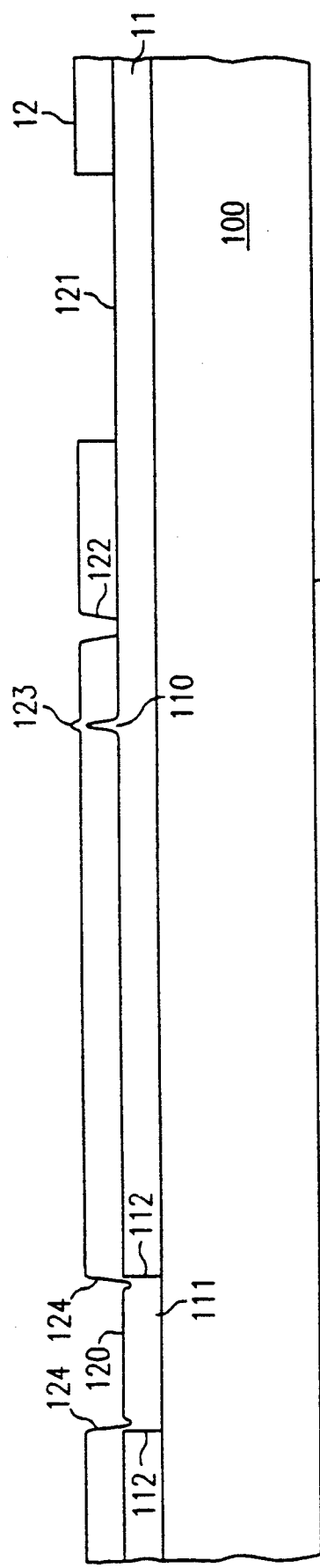
FIG. 1 is a substrate showing CMOS artifacts.

FIG. 1 illustrates how typical CMOS process artifacts can lead to reduced DMD superstructure yields. These artifacts include aluminum hillocks 110, pinholes 122 in the protective oxide, nonplanar chip surface and protective oxide contacts with steep sidewalls 112.

Figure 2:
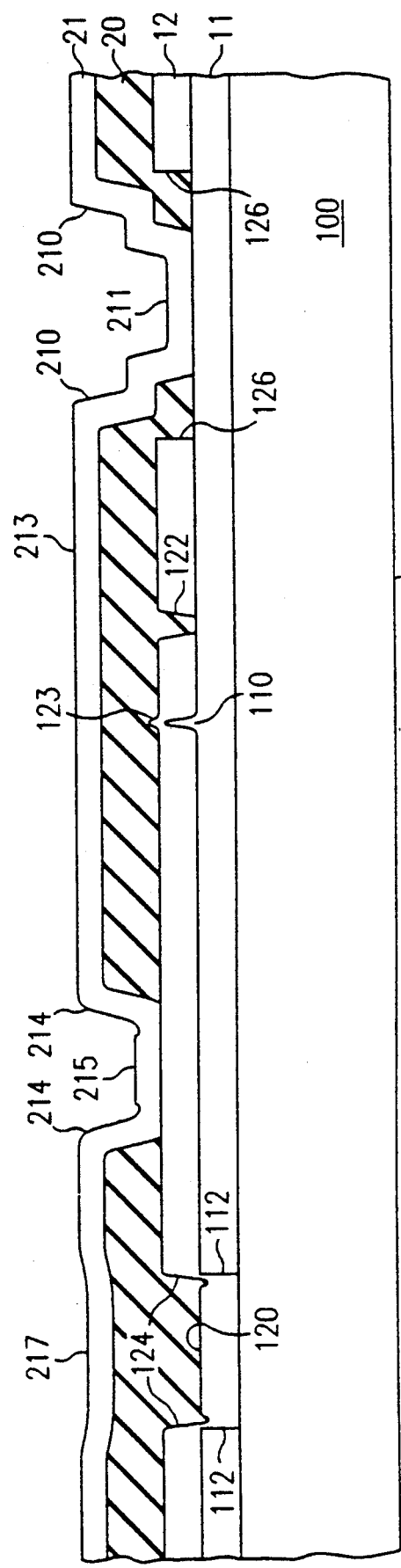
FIG. 2 is a substrate with a spacer added to remove the effect of the CMOS artifacts and showing overlying electrodes.

A modified DMD superstructure architecture that eliminates these artifacts is shown in FIG. 2. It consists of a planarizing organic spacer 20 (typically 0.5 $\mu$m thick) spun over the CMOS address structure 100, 11 and 12 prior to the electrode metal deposition. This spacer is distinguished from the conventional DMD spacer formed between the electrode and beam. Contact openings 211 and electrode support post holes 215 are patterned in spacer 20 and the spacer is deep UV hardened to a temperature 10° to 20° C. hotter than the hardening temperature for the DMD spacer which is typically 180° C. The hardening program is chosen to give slightly tapered sidewalls 210, 214 to the contacts 211 and support posts 215 for good metal step coverage.

Gaps 112 between leads of the final CMOS metalization layers are planarized 217. Hillocks 110 are planarized and air gap isolation is provided over the weakened overlying protective oxide. Air gap isolation is also provided over pinholes 122 in the protective oxide. Finally, the steep oxide sidewalls 126 of the protective oxide contacts 211 are replaced by the sloped contacts 210 of spacer 20. The electrode metal 21 is deposited and patterned after the deposition of spacer 20.

There are additional benefits to the modified DMD superstructure architecture. Because the landing electrodes are air isolated from the address circuit, there is reduced parasitic coupling of the fast rise-time, high-voltage reset pulse train to the underlying address circuit. This coupling, if uncontrolled, can produce voltage spikes on the gates of the address transistors, causing the transistors to momentarily turn on at the wrong time.

Finally, because the address electrodes are air isolated, they have reduced capacitance. It is therefore possible with this modified DMD superstructure architecture to build a frame-addressed DMD (U.S. Pat. No. 4,615,595) where the address electrode rather than the beam is charge-addressed.

In summary, this new architecture minimizes the yield loss caused by CMOS process artifacts, reduces parasitic coupling between the DMD and CMOS and provides an alternate architecture for the charge-addressed DMD.

Figure 3:
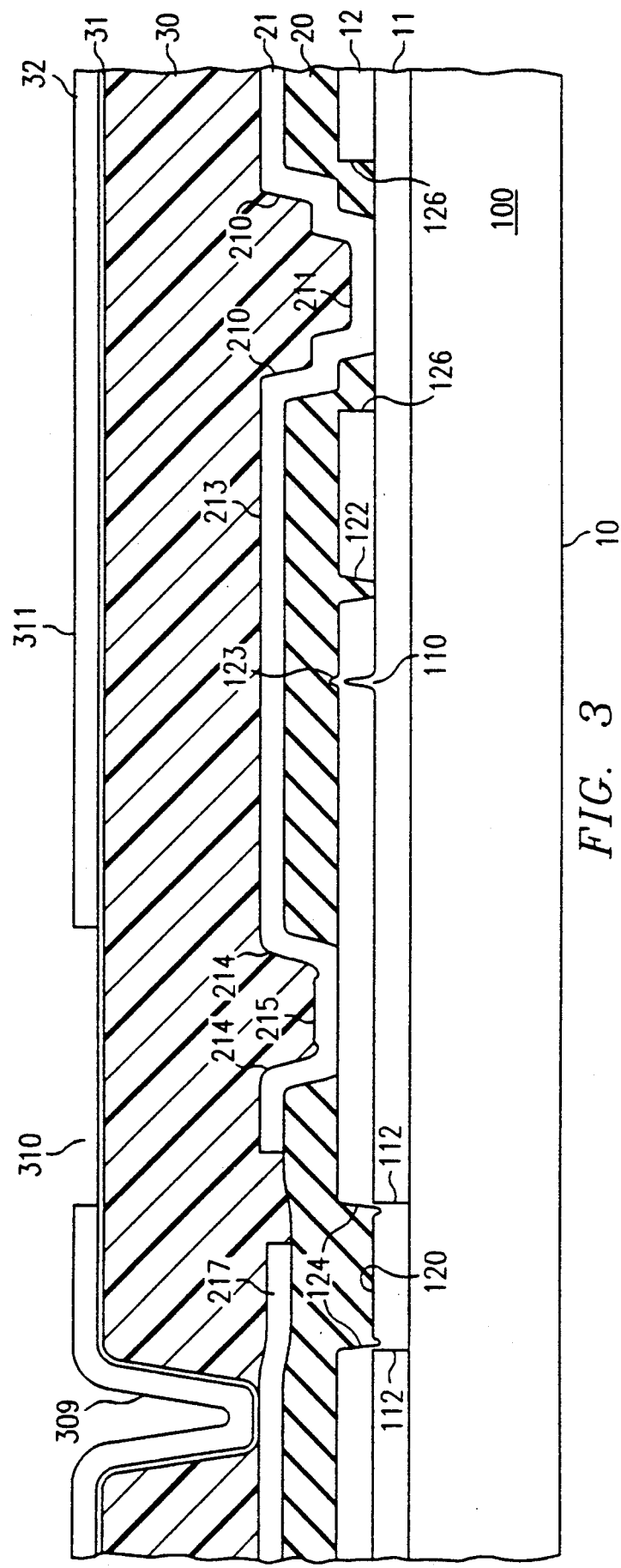
FIG. 3 is the completed structure before the spacers are removed.

Then as shown in FIG. 3, spacer 30 is spindeposited over the electrodes and patterned with holes that will form beam support posts 309. Spacer 30 determines the torsion beam angular deflection and is typically 2.3 microns thick and is a positive photoresistant. It is deep UV hardened to a temperature of 180° C. to prevent flow and bubbling during subsequent processing steps. Note that no degradation of spacer 20 occurs during this bake because spacer 20 was hardened to a higher temperature (200° C.). Finally, thin hinges 310 and thick beams 311 are formed on spacer 30 by a deposition and patterning process shown in the aforementioned U.S. Pat. No. 4,662,746.

Figure 4:
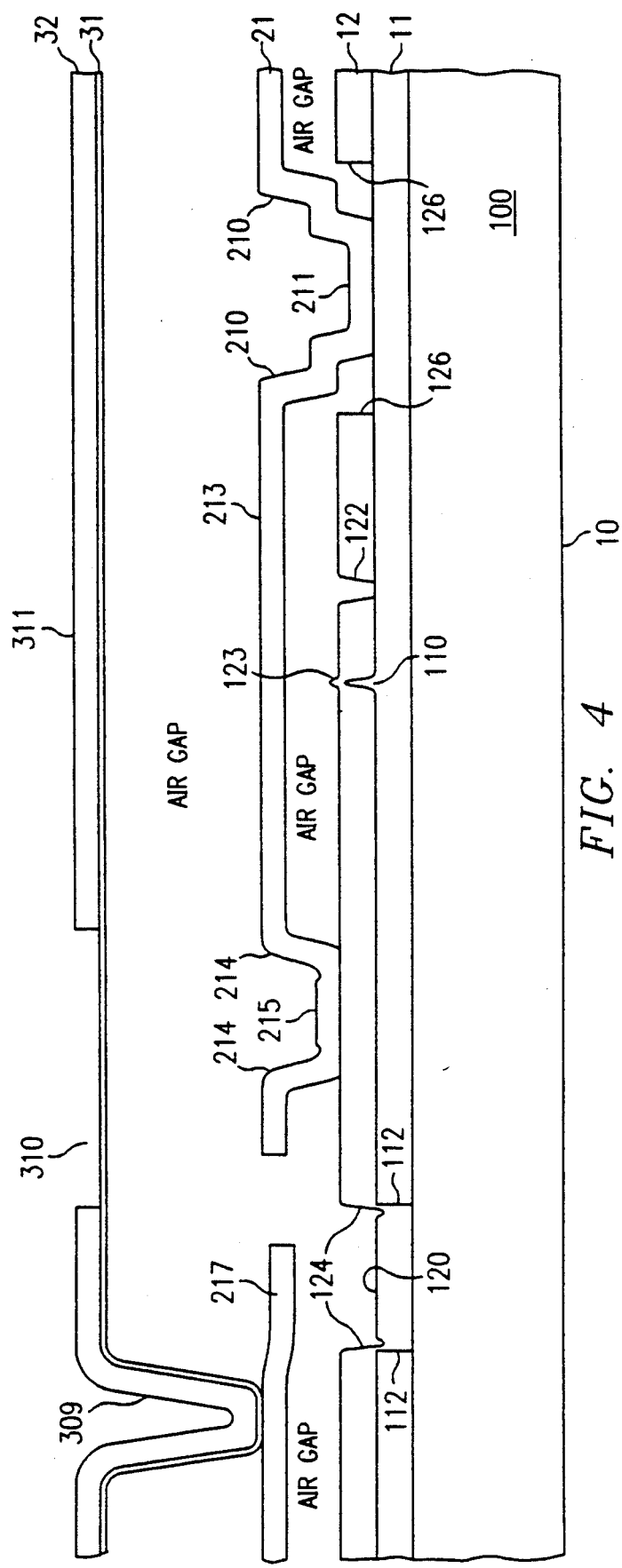
FIG. 4 is the completed structure with the spacers removed.

This completes the process at the wafer level. The wafers are then coated with PMMA, sawed into individual chips and pulse spin-cleaned with chlorobenzene. Finally, the chips are placed in a plasma etching chamber where both spacer layers 20 and 30 are completely removed to form the air gaps under the hinges and beams as shown in FIG. 4.

Although this description describes the invention with reference to the above specified embodiments, the claims and not this description limits the scope of the invention. Various modifications of the disclosed embodiment, as well as alternative embodiments of the invention, will become apparent to persons skilled in the art upon reference to the above description. Therefore, the appended claims will cover such modifications that fall within the true scope of the invention.

What is claimed is:

1. A method of planarizing an integrated semiconductor substrate for the purpose of constructing thereon an electromechanical device, said method comprising the steps of:

spinning on a first spacer consisting of a planarizing liquid organic material covering said substrate;

patterning and curing said first spacer to form first support posts electrodes of said electromechanical device;

forming said electrodes over said first spacer;

spinning on a second spacer consisting of a planarizing liquid organic material covering said electrodes;

patterning and curing said second spacer to form second support posts for the mechanical portion of said electromechanical device;

establishing on a said second spacer a plurality of mechanical elements supported by said second support posts; and removing said first and second spacers.

2. The method set forth in claim 1 wherein said removing step allows mechanical gaps to exist between certain portions of said integrated semi-conductor substrate and said formed electrodes and between certain portions of said formed electrodes and said established mechanical elements.

3. The method set forth in claim 2 wherein said substrate is a CMOS substrate having a traditional oxide or nitride protective top coating over which said planarizing liquid is spun-on.

4. The method of planarizing an existing CMOS substrate containing integrated circuits and formed having a traditional protective oxide or nitride top covering and wherein said existing substrate top covering contains hillocks, pin holes, or steep sidewall contact areas, the method comprising the steps of:

spinning-on a planarizing material covering said top covering;

patterning said planarizing material to allow for the formation of support posts in physical contact with said top covering;

curing said planarizing material to withstand a first certain temperature;

forming on top of said cured planarizing material a first mechanical structure containing support posts in physical contact with said top covering; and removing said cured planarizing material to leave a mechanical gap between said top covering and said formed first mechanical structure, except where said support posts of said mechanical structure contact said top covering.

* * * * *